United States Patent
Chu et al.

(10) Patent No.: US 8,023,347 B2
(45) Date of Patent: Sep. 20, 2011

(54) ANTI-FUSE REPAIR CONTROL CIRCUIT AND SEMICONDUCTOR DEVICE INCLUDING DRAM HAVING THE SAME

(75) Inventors: Shin Ho Chu, Gyeonggi-do (KR); Sun Mo An, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/704,674

(22) Filed: Feb. 12, 2010

(65) Prior Publication Data
US 2010/0142299 A1 Jun. 10, 2010

Related U.S. Application Data

(63) Continuation of application No. 11/964,155, filed on Dec. 26, 2007, now Pat. No. 7,688,663.

(30) Foreign Application Priority Data
Nov. 30, 2007 (KR) ........................ 10-2007-0123753

(51) Int. Cl.
*G11C 7/00* (2006.01)
(52) U.S. Cl. ........ 365/200; 365/201; 365/203; 365/204; 365/230.03

(58) Field of Classification Search .................. 365/201, 365/200, 225.7, 203, 204, 230.03
See application file for complete search history.

(56) References Cited

U.S. PATENT DOCUMENTS

| | | | | |
|---|---|---|---|---|
| 6,311,299 B1 * | 10/2001 | Bunker | ......................... | 714/719 |
| 6,414,890 B2 * | 7/2002 | Arimoto et al. | ............... | 365/201 |
| 6,418,067 B1 * | 7/2002 | Watanabe et al. | .............. | 365/200 |
| 6,768,694 B2 * | 7/2004 | Anand et al. | ............... | 365/225.7 |

* cited by examiner

*Primary Examiner* — Pho M Luu
*Assistant Examiner* — Tha-O Bui
(74) *Attorney, Agent, or Firm* — Ladas & Parry LLP

(57) ABSTRACT

In an anti-fuse repair control circuit, a semiconductor memory device is integrated into a multi-chip package to perform an anti-fuse repair. An anti-fuse repair control circuit includes a data mask signal input circuit, a cell address enable unit a repair enable unit, and a repair unit. The data mask signal input circuit receives and outputs a data mask signal upon receiving a test control signal for an anti-fuse repair. The cell address enable unit receives an anti-fuse repair address to enable a cell address of an anti-fuse cell to be repaired upon receiving the data mask signal outputted from the data mask signal input circuit. The repair enable unit codes the cell address and output a repair enable signal and a drive signal according to whether or not an anti-fuse cell corresponding to the cell address is enabled. The repair unit supplies a repair voltage to the anti-fuse cell when the repair enable signal, the address, and the drive signal are enabled.

16 Claims, 5 Drawing Sheets

ANTI-FUSE REPAIR CONTROL CIRCUIT AND SEMICONDUCTOR DEVICE INCLUDING DRAM HAVING THE SAME

CROSS-REFERENCE TO RELATED APPLICATIONS

The present application claims priority to Korean patent application number 10-2007-0123753 filed on Nov. 30, 2007, which is incorporated herein by reference in its entirety.

BACKGROUND OF THE INVENTION

The present invention relates generally to a semiconductor memory device, and more particularly to an anti-fuse repair control circuit, in which a semiconductor memory device integrated into a multi-chip package is improved to individually perform an anti-fuse repair, and a semiconductor device including a DRAM which has the anti-fuse repair control circuit when integrated into a multi-chip package.

Recently, a variety of mobile devices have been developed and a semiconductor device having multi-functions is required in order to improve the function of those mobile devices.

The semiconductor device as a single memory chip is limited in realizing the required multi-functions. Accordingly, a semiconductor device is often realized in a structure of a multi-chip package, in which the semiconductor device is integrated with the same DRAMs in the same package or is integrated with a DRAM and a flash memory in the same package.

For a semiconductor device, which is realized as a package as described above, an anti-fuse repair technique is used to repair a bit fail occurring in an integrated chip, such as a DRAM.

According to the anti-fuse repair technique, a bit fail is repaired by melting an anti-fuse with a high voltage between both ends of the anti-fuse corresponding to a position where a bit fail has occurred, not by cutting a fuse element with a laser beam.

A typical multi-chip package has a structure in which an input address, a clock signal, and a command are shared by the mounted chips. FIG. 1A illustrates a case in which a flash memory and two mobile DRAMs are integrated into one package. FIG. 1B illustrates a case in which two mobile DRAMs are integrated into one package.

As illustrated in FIGS. 1A and 1B, two DRAMS included in a multi-chip package have separate data input/output (DATA 10) ports but share an input address, a clock signal, and a command.

Therefore, if a bit fail occurs in either one of the DRAMs, then repair information is transmitted to both DRAMs. As a result, the DRAM in which the bit fail occurred as well as the normal DRAM, in which no bit fail occurred, perform an anti-fuse repair operation at the same time.

Accordingly, in performing an anti-fuse repair operation in a conventional multi-chip package by a semiconductor device, a normal DRAM would perform an unnecessary anti-fuse repair operation, because the DRAMs in a conventional multi-chip package share the input address and the clock signal and the command as discussed above. Consequently, in a conventional multi-chip package, the overall repair efficiency of the semiconductor device decreases to less than half due to performance of the unnecessary anti-fuse repair operations.

SUMMARY OF THE INVENTION

The present invention provides an anti-fuse repair control circuit, which can mask a repair operation by a data mask signal in a case where an anti-fuse repair is not associated with itself.

Further, the present invention selectively performs a repair operation on only a DRAM in which a bit fail has occurred, thereby improving the repair efficiency of a semiconductor device such as a multi-chip package mounted with a plurality of DRAMs.

An anti-fuse repair control circuit according to an embodiment of the present invention includes a data mask signal input circuit which receives a data mask signal from the outside, and outputs the data mask signal when a test control signal is received for an anti-fuse repair, a cell address enable unit which receives an anti-fuse repair address to enable a cell address of an anti-fuse cell to be repaired when the data mask signal outputted from the data mask signal input circuit is received, a repair enable unit which codes the cell address outputted from the cell address enable unit to generate and output a repair enable signal and a drive signal, according to whether or not an anti-fuse cell corresponding to the cell address is enabled, and a repair unit which supplies a repair voltage to the anti-fuse cell when the repair enable signal and the cell address are enabled in a state that the drive signal is enabled.

Here, the data mask signal input circuit may include a test control unit which outputs a data mask enable signal when the test control signal is received, and a data mask buffer which buffers the data mask signal received from the outside, and outputs the buffered data mask signal according to the state of the data mask enable signal.

The test control unit may further include an output unit which outputs a pumping enable signal for controlling pumping of the repair voltage for an anti-fuse repair when both the test control signal and the buffered data mask signal are received.

Moreover, the repair enable unit may include a row repair enable unit which codes the cell address to generate a row repair enable signal and a row drive signal, and the row repair enable unit outputs the row repair enable signal and the row drive signal, according to whether or not an anti-fuse cell corresponding to the cell address is enabled, and a column repair enable unit which codes the cell address to generate a column repair enable signal and a column drive signal, and the column repair enable unit outputs the column repair enable signal and the column drive signal according to whether or not an anti-fuse cell corresponding to the cell address is enabled.

Furthermore, the row repair enable unit may include a coding unit which codes the cell address to generate the row repair enable signal and the row drive signal, a first output unit which outputs the row repair enable signal according to an enable state of the anti-fuse cell, and a second output unit which outputs the row drive signal according to an enable state of the anti-fuse cell.

Furthermore, the coding unit may logically NAND combine a row address and an inverted column address of the cell address to generate the row repair enable signal, and the coding unit may logically NAND combine the row address and the column address to generate the row drive signal.

Moreover, the column repair enable unit may include a coding unit which codes the cell address to generate the column repair enable signal and the column drive signal, a first output unit which outputs the column repair enable signal according to an enable state of the anti-fuse cell, and a second output unit which outputs the column drive signal according to an enable state of the anti-fuse cell.

Furthermore, the coding unit may logically NAND combine a column address and an inverted row address of the cell address to generate the row repair enable signal, and the coding unit may logically NAND combine the row address and the column address to generate the column drive signal.

On the other hand, a semiconductor device according to the present invention includes a plurality of DRAMs in a package in which the plurality of DRAMs share at least a command and an anti-fuse repair address, and each DRAM independently receives a data mask signal, and the DRAM has the afore-mentioned anti-fuse repair control circuit.

DESCRIPTION OF SPECIFIC EMBODIMENTS

According to an embodiment of the present invention, if an anti-fuse repair is associated with itself, then an anti-fuse repair operation is performed, and if an anti-fuse repair is not associated with itself, then a repair operation is masked by a data mask signal, thereby preventing the performance of unnecessary repair operations.

Moreover, in a multi-chip package mounted with a plurality of DRAMs, a repair operation is selectively performed only on a DRAM in which a bit fail has occurred, thereby improving the repair efficiency.

Figure 1A:
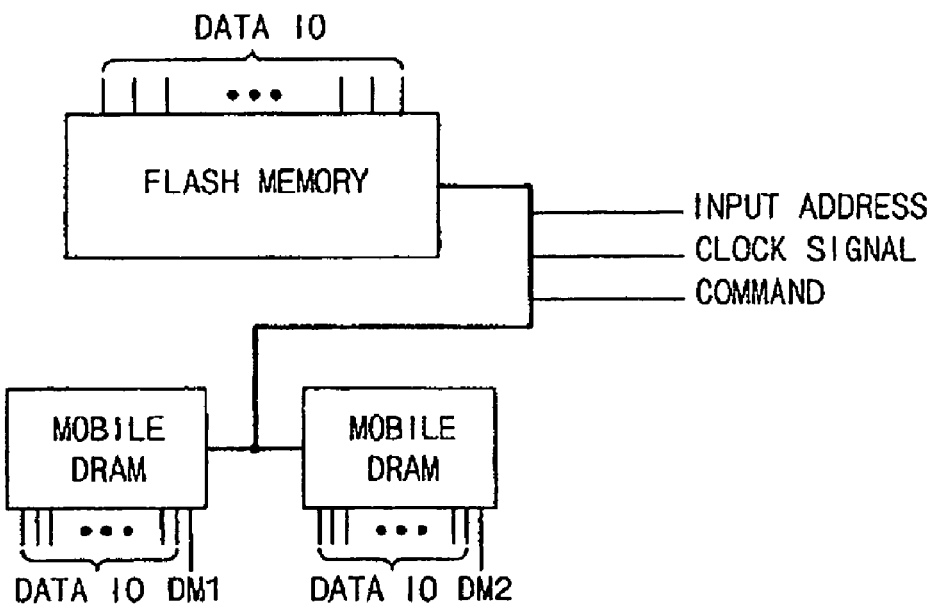
FIGS. 1A and 1B are block diagrams illustrating a semiconductor device having a general structure of a multi-chip package.
Figure 1B:
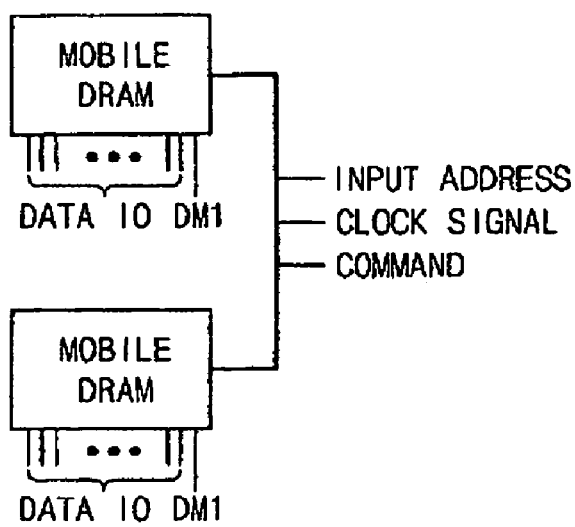

As illustrated in FIGS. 1A and 1B according to an embodiment of the present invention, the above-described novel technique(s) can be applied to a semiconductor device in which more than two DRAMs are realized by a multi-chip package, since the structure according to an embodiment of the present invention is configured to selectively perform repair operations on the particular DRAM having a bit fail using a data mask signal. In the above configuration, each DRAM shares an input address, and a clock signal, and a command, but each DRAM has a separated data input/output port.

In a selected DRAM, a bit fail can be resolved by applying a high voltage between both ends of the anti-fuse at the position where the bit fail has occurred at a package level to melt the anti-fuse, and a bit fail operation is not performed in a DRAM for which a repair operation is masked.

Figure 2:
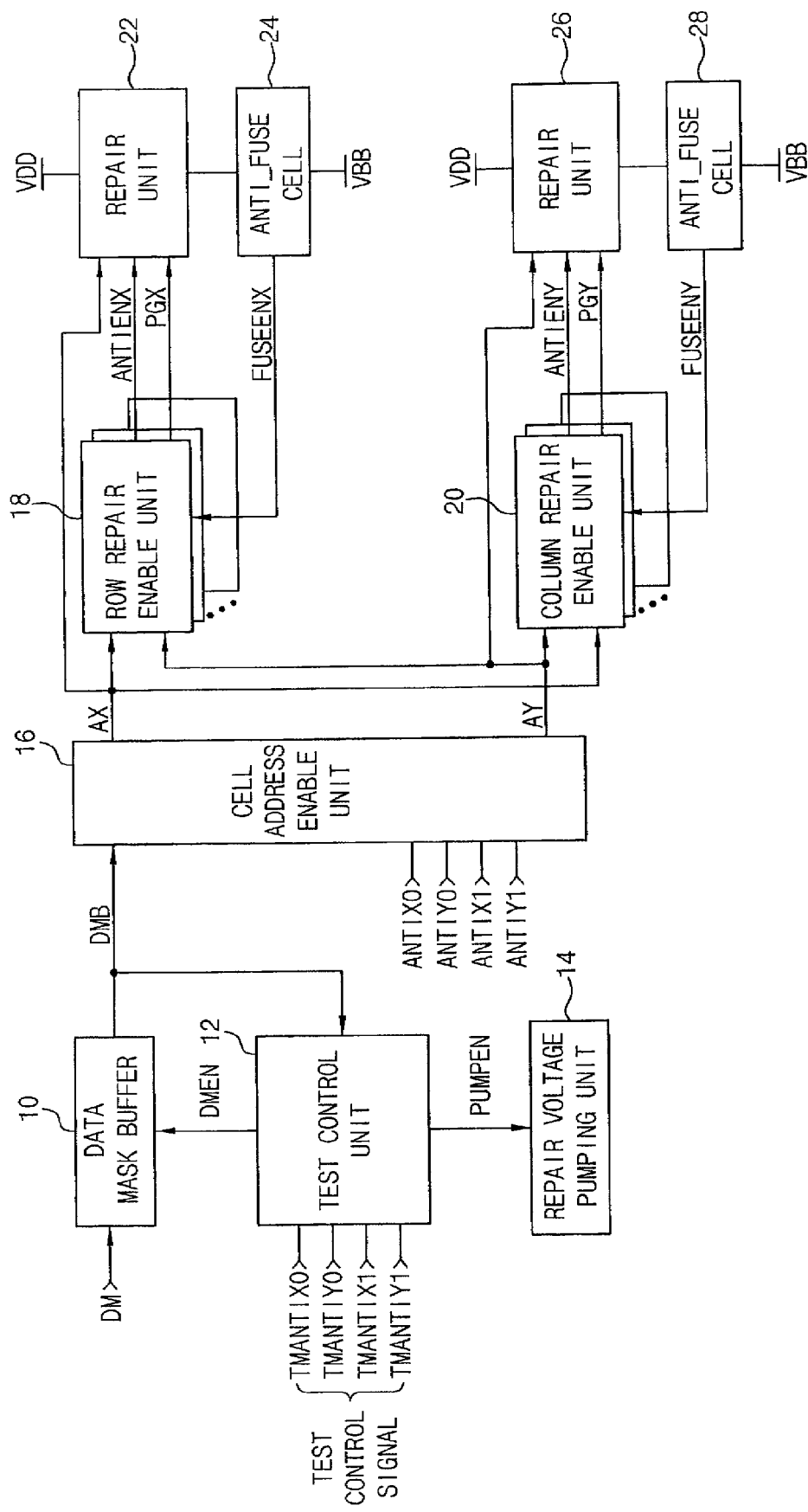
FIG. 2 is a block diagram illustrating a preferred embodiment of an anti-fuse repair control circuit according to the present invention.

As illustrated in FIG. 2, an anti-fuse repair control circuit is configured in each DRAM of a semiconductor device, which is realized by a multi-chip package.

The anti-fuse repair control circuit as illustrated in FIG. 2 is included in a plurality of DRAMs in a package in which the DRAMs share at least a command and an anti-fuse repair address, and each DRAM independently receives a data mask signal.

The anti-fuse repair control circuit configured in a DRAM includes a data mask buffer 10 which receives a data mask signal DM, a test control unit 12 which receives test control signals TMANTIX0, TMANTIY0, TMANTIX1, and TMANTIY1, a repair voltage pumping unit 14 which pumps a repair voltage, a cell address enable unit 16 which receives a buffered data mask signal DMB and an anti-fuse repair address ANTIX0, ANTIY0, ANTIX1, and ANTIY1, a row repair enable unit 18 and a column repair enable unit 20 which receive a cell address AX and AY, repair units 22 and 26, and anti-fuse cells 24 and 28.

The data mask buffer 10 and test control unit 12 constitute a data mask signal input circuit. The row repair enable unit 18 and column repair enable unit 20 are comprised of a number corresponding to a row address and a column address, and the repair units 22 and 26 and anti-fuse cells 24 and 28 correspond to the row address and column address respectively.

When the data mask enable signal DMEN is disabled, the data mask buffer 10 receives and buffers the data mask signal DM and outputs the buffered data mask signal DMB. When the data mask enable signal DMEN is enabled the data mask buffer 10 does not output the buffered data mask signal.

The test control unit 12 receives test control signals TMANTIX0, TMANTIY0, TMANTIX1, and TMANTIY1. The test control unit 12 then uses the above test control signals to generate a data mask enable signal DMEN, and provides the data mask enable signal DMEN to the data mask buffer 10. In addition, when a buffered data mask signal DMB is outputted from the data mask buffer 10 the test control unit 12 generates a pumping enable signal PUMPEN, and provides the pumping enable signal PUMPEN to the repair voltage pumping unit 14.

Here, when a pumping enable signal PUMPEN is applied the repair voltage pumping unit 14 pumps a supply voltage VDD and a back-bias voltage VBB, which will be used for repair. At this time, as an example, if the supply voltage is 1.8V and the back-bias voltage is −1.8V at a normal state, then the supply voltage for an anti-fuse repair is pumped at 3.5V, and the back-bias voltage is also pumped at −3.5V.

Figure 3:
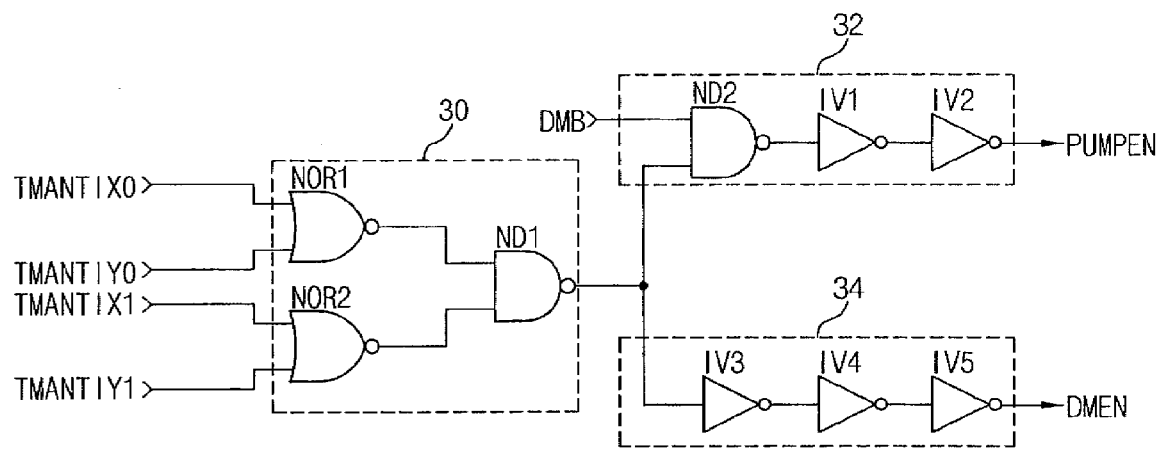
FIG. 3 is a detailed circuit diagram illustrating an embodiment of a test control unit 12 of FIG. 2.

Furthermore, as illustrated in FIG. 3, the test control unit 12 includes an input unit 30, a pumping enable signal output unit 32, and a data mask enable signal output unit 34.

The input unit 30 includes a NOR gate NOR1 which receives test control signals TMANTIX0 and TMANTIY0, a NOR gate NOR2 which receives test control signals TMANTIX1, and TMANTIY1, and a NAND gate ND1 which receives the outputs of the NOR gates. The input unit 30 outputs a high level signal when at least any one of the plurality of test control signals is inputted as high level.

Furthermore, the pumping enable signal output unit 32 includes a NAND gate ND2 which receives a buffered data mask signal DMB and an output of the NAND gate ND1 of the input unit 30, and inverters IV1 and IV2 which are connected in series to this gate ND2. Accordingly, the pumping enable signal output unit 32 outputs an output of the NAND gate ND1 of the input unit 30 as a pumping enable signal PUMPEN through a plurality of inverting stages when the buffered data mask signal DMB is outputted.

The cell address enable unit 16 enables a cell address AX and AY when the cell address enable unit 16 receives a data mask signal DMB, from the data mask buffer 10, is in an enabled state. The Cell address enable unit 16 does not enable the cell address AX and AY when the data mask signal DMB, received from the data mask buffer, is in a disabled state. In other words, the cell address enable unit 16 performs an operation for selecting its own cell for a repair operation by cell activation.

Figure 4:
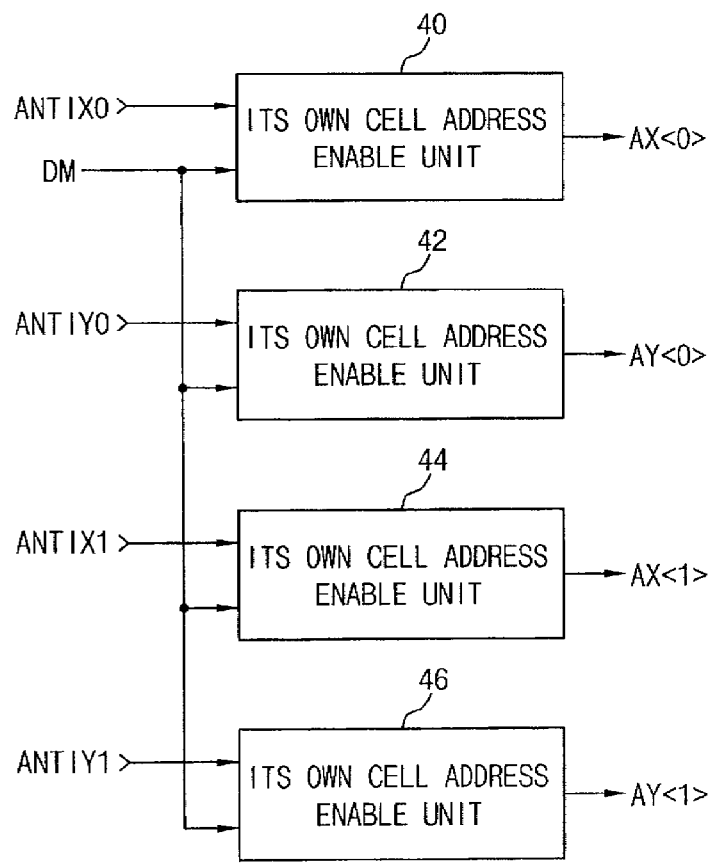
FIG. 4 is a detailed block diagram illustrating a cell address enable unit 16 of FIG. 2.

For this, as illustrated in FIG. 4, the cell address enable unit 16 includes a plurality of its own cell address enable units 40, 42, 44 and 46, and each of its own cell address enable units 40, 42, 44 and 46 shares a data mask signal DM (where DM as illustrated in FIG. 4 means a DMB outputted from the data mask buffer 10 of FIG. 2.) Furthermore, its own cell address enable units 40, 42, 44 and 46 respectively receive an anti-fuse repair address ANTIX0, ANTIY0, ANTIX1, and ANTIY1. Accordingly, each of its own cell address enable units 40, 42, 44 and 46 outputs a cell address AX and AY (AX<0>, AY<0>, AX<1>, AY<1>) according to the enable state of the data mask signal DM.

The row repair enable unit 18 and the column repair enable unit 20 constitute a repair enable unit.

Here, the row repair enable unit 18 receives a cell address AX and AY outputted from the cell address enable unit 16 and the row repair enable unit 18 then codes the cell address AX and AY to generate and output a repair enable signal ANTIENX and a drive signal PGX according to whether or not an anti-fuse cell 24 corresponding to a cell address AX and AY is enabled, i.e., according to the state of an anti-fuse enable signal FUSEENX.

Figure 5:
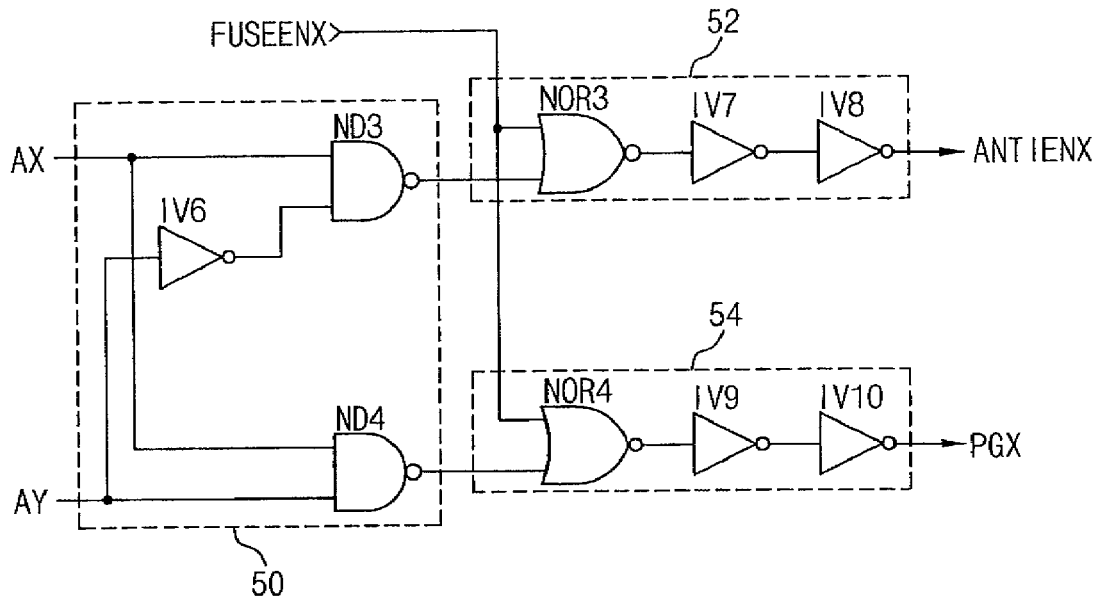
FIG. 5 is a detailed circuit diagram illustrating an embodiment of a row repair enable unit 18 of FIG. 2.

The row repair enable unit 18, as illustrated in FIG. 5, includes a coding unit 50, an output unit 52 which outputs a repair enable signal ANTIENX, and an output unit 54 which outputs a drive signal PGX.

The coding unit 50 includes an inverter IV6 which receives a column address AY of a cell address, a NAND gate ND3 which receives a row address AX and the output of the inverter IV6, and a NAND gate ND4 which receives a row address AX and a column address AY. The output unit 52 includes a NOR gate NOR3, which receives an anti-fuse enable signal FUSEENX and an output of the NAND gate ND3 of the coding unit 50, and inverters IV7 and IV8. The output unit 54 includes a NOR gate NOR4, which receives an anti-fuse enable signal FUSEENX and an output of the NAND gate ND4 of the coding unit 50, and inverters IV9 and IV10. Accordingly, the output unit 52 outputs an output of the NAND gate ND3 of the coding unit 50 as a repair enable signal ANTIENX according to the state of the anti-fuse enable signal FUSEENX, and the output unit 54 outputs an output of the NAND gate ND4 of the coding unit 50 as a drive signal PGX according to the state of the anti-fuse enable signal FUSEENX.

As a result, the output unit 52 outputs a repair enable signal ANTIENX and output unit 54 outputs a drive signal PGX. according to the state of the anti-fuse enable signal FUSEENX, or in other words, when the anti-fuse cell 24 has not yet been repaired.

Moreover, the column repair enable unit 20 codes a cell address AX and AY received from the cell address enable unit 16 to generate and output a repair enable signal ANTIENY and a drive signal PGY according to whether or not an anti-fuse cell 28 corresponding to a cell address AX and AY is enabled, i.e., according to a state of an anti-fuse enable signal FUSEENY.

Figure 6:
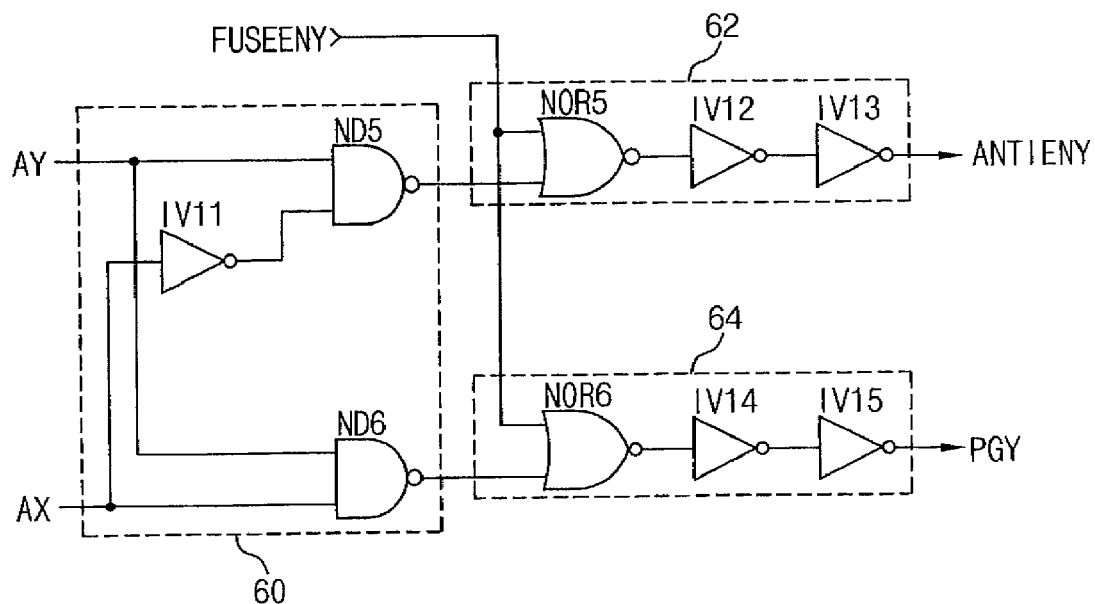
FIG. 6 is a detailed circuit diagram illustrating an embodiment of a column repair enable unit 20 of FIG. 2.

The column repair enable unit 20, as illustrated in FIG. 6, includes a coding unit 60, an output unit 62 which outputs a repair enable signal ANTIENY, and an output unit 64 which outputs a drive signal PGY.

The coding unit 60 includes an inverter IV11 which receives a row address AX of a cell address, a NAND gate ND5 which receives a column address AY and the output of the inverter IV11, and a NAND gate ND6 which receives a row address AX and a column address AY. The output unit 62 includes a NOR gate NOR5, which receives an anti-fuse enable signal FUSEENY and an output of the NAND gate ND5 of the coding unit 60, and inverters IV12 and IV13. The output unit 64 includes a NOR gate NOR6, which receives an anti-fuse enable signal FUSEENY and an output of the NAND gate ND6 of the coding unit 60, and inverters IV14 and IV15. Accordingly, the output unit 62 outputs an output of the NAND gate ND5 of the coding unit 60 as a repair enable signal ANTIENY according to the state of the anti-fuse enable signal FUSEENY, and the output unit 64 outputs an output of the NAND gate ND6 of the coding unit 60 as a drive signal PGY according to the state of the anti-fuse enable signal FUSEENY.

As a result, the output units 62 outputs a repair enable signal ANTIENY and output unit 64 outputs a drive signal PGY according to the state of the anti-fuse enable signal FUSEENY, or in other words, when the anti-fuse cell 28 has not yet been repaired.

The repair units 22 and 26 are similar in their configuration, but different only in that their cell address, repair enable address and drive signal correspond to either a row AX or a column AY. Therefore, a configuration of the repair unit 22 will be described with reference to FIG. 7, and the duplicated explanation and drawing of repair unit 26 will be omitted.

The repair unit 22 performs a drive operation to provide a higher supply voltage and a lower back-bias voltage, which has been pumped in the repair voltage pumping unit 14, to an anti-fuse cell 24 when a repair enable signal ANTIENX and a row address AX are enabled in a state the a drive signal PGX is enabled.

Figure 7:
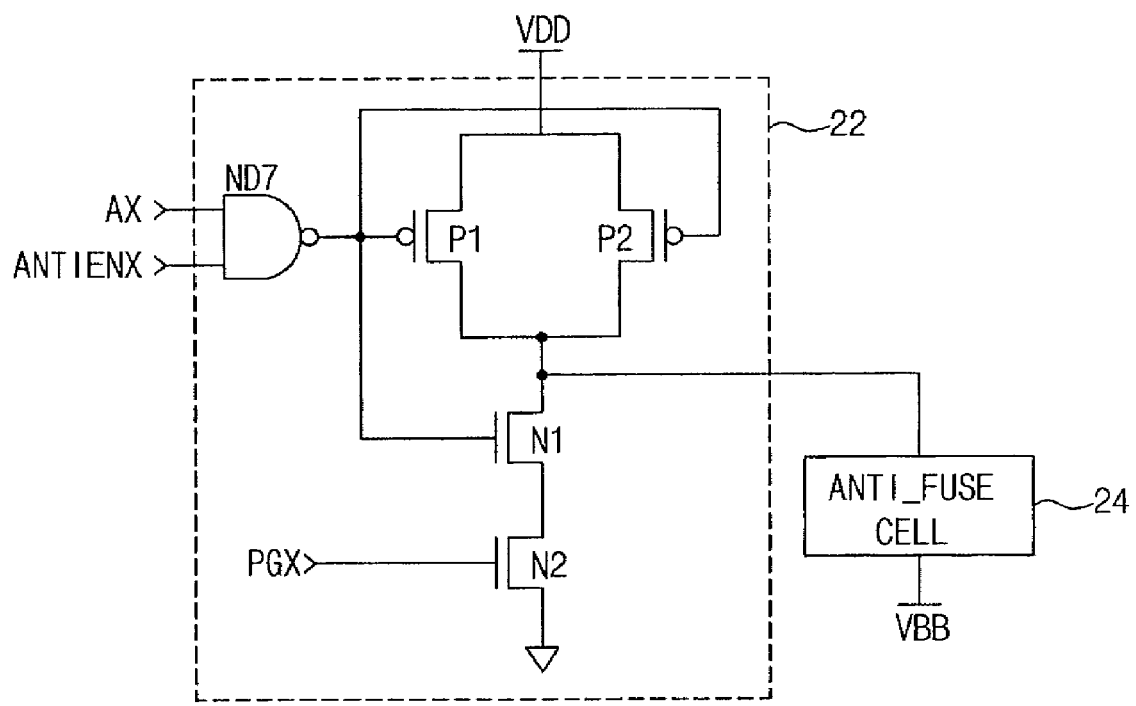
FIG. 7 is a detailed circuit diagram illustrating an embodiment of a repair unit 22 of FIG. 2.

Referring to FIG. 7, the repair unit 22 includes a NAND gate ND7 which receives a row address AX and a repair enable signal ANTIENX. The repair unit 22 further includes pull-up PMOS transistors P1 and P2, which are connected in parallel to the supply voltage VDD and an NMOS transistor N1. The NMOS transistor N1 is configured for pull-down and is connected in series with an NMOS transistor N2 to prevent floating of the node connected to the anti-fuse cell 24 unless the address is selected.

The repair unit 22 applies a high level of the supply voltage VDD to the anti-fuse cell 24 by turning on the PMOS transistors P1 and P2 when its own row address AX of the repair enable signal ANTIENX and the cell address are inputted in a high state. Then a high level of the supply voltage VDD and a low level of the back-bias voltage VBB are applied to both ends of the anti-fuse cell 24, this high voltage difference between both ends melts the anti-fuse cell. In other words, the anti-fuse cell is shorted, thereby performing a repair on a bit fail.

As described above, a repair operation is not performed by a mask signal on a normal DRAM included in a semiconductor device having a multi-chip package structure, rather it is performed only on a DRAM in which a bit fail has occurred. Accordingly, the repair efficiency can be improved by utilizing the present invention.

What is claimed is:
1. A repair control circuit, comprising:
    a data mask signal input unit configured to buffer a data mask signal from the outside, and output a buffered data mask signal and a pump enable signal in response to a test control signal for a repair;
    a repair voltage pumping unit configured to pump a supply voltage and a back-bias voltage to generate a repair voltage in response to the pump enable signal;

a cell address enable unit configured to enable a cell address of a cell to be repaired in response to a repair address and the buffered data mask signal;

a repair enable unit configured to code the cell address output from the cell address enable unit to generate a repair enable signal and a drive signal according to whether or not a cell corresponding to the cell address is enabled, wherein the repair enable unit comprises a plurality of row repair enable units whose number corresponds to the number of a row address and a plurality of column repair enable units whose number corresponds to the number of a column address; and a repair unit configured to supply the repair voltage to the cell when the repair enable signal and the cell address are enabled in a state that the drive signal is enabled.

2. The repair control circuit as set forth in claim 1, wherein the data mask signal input unit comprises:

a test control unit configured to output a data mask enable signal in response to the test control signal; and a data mask buffer configured to buffer the data mask signal received from the outside to output the buffered data mask signal according to the state of the data mask enable signal.

3. The repair control circuit as set forth in claim 2, wherein the test control unit comprises:

an output unit configured to output the pumping enable signal for controlling pumping of the repair voltage when both the test control signal and the buffered data mask signal are received.

4. The repair control circuit as set forth in claim 1, wherein each row repair enable unit codes the cell address to generate a row repair enable signal and a row drive signal according to whether or not a cell corresponding to the cell address is enabled; and each column repair enable unit codes the cell address to generate a column repair enable signal and a column drive signal according to whether or not a cell corresponding to the cell address is enabled.

5. The repair control circuit as set forth in claim 4, wherein each row repair enable unit comprises:

a coding unit configured to code the cell address to generate the row repair enable signal and the row drive signal;

a first output unit configured to output the row repair enable signal according to an enable state of the cell; and a second output unit configured to output the row drive signal according to an enable state of the cell.

6. The repair control circuit as set forth in claim 5, wherein the coding unit logically NAND combines the row address and an inverted column address of the cell address to generate the row repair enable signal, and the coding unit logically NAND combines the row address and the column address to generate the row drive signal.

7. The repair control circuit as set forth in claim 4, wherein each column repair enable unit comprises:

a coding unit configured to code the cell address to generate the column repair enable signal and the column drive signal;

a first output unit configured to output the column repair enable signal according to an enable state of the cell; and a second output unit configured to output the column drive signal according to an enable state of the cell.

8. The repair control circuit as set forth in claim 7, wherein the coding unit logically NAND combines the column address and an inverted row address of the cell address to generate the row repair enable signal, and the coding unit logically NAND combines the row address and the column address to generate the column drive signal.

9. A semiconductor device including a plurality of DRAMs in a package in which the plurality of DRAMs shares at least a command and a repair address, and each DRAM independently receives a data mask signal, and the DRAM comprises:

a data mask signal input unit configured to buffer the data mask signal, and output a buffered data mask signal and a pump enable signal in response to a test control signal for a repair;

a repair voltage pumping unit configured to pump a supply voltage and a back-bias voltage to generate a repair voltage in response to the pump enable signal;

a cell address enable unit configured to enable a cell address of a cell to be repaired in response to a repair address and the buffered data mask signal;

a repair enable unit configured to code the cell address outputted from the cell address enable unit to generate a repair enable signal and a drive signal according to whether or not a cell corresponding to the cell address is enabled, wherein the repair enable unit comprises a plurality of row repair enable units whose number corresponds to the number of a row address and a plurality of column repair enable units whose number corresponds to the number of a column address; and a repair unit configured to supply the repair voltage to the cell when the repair enable signal and the cell address are enabled in a state that the drive signal is enabled.

10. The semiconductor device as set forth in claim 9, wherein the data mask signal input unit comprises:

a test control unit configured to output a data mask enable signal in response to the test control signal; and a data mask buffer configured to buffer the data mask signal received from the outside, and outputs the buffered data mask signal according to the state of the data mask enable signal.

11. The semiconductor device as set forth in claim 10, wherein the test control unit comprises:

an output unit configured to output the pumping enable signal for controlling pumping of the repair voltage when both the test control signal and the buffered data mask signal are received.

12. The semiconductor device as set forth in claim 9, wherein each row repair enable unit codes the cell address to generate a row repair enable signal and a row drive signal according to whether or not a cell corresponding to the cell address is enabled; and each column repair enable unit codes the cell address to generate a column repair enable signal and a column drive signal according to whether or not a cell corresponding to the cell address is enabled.

13. The semiconductor device as set forth in claim 12, wherein each row repair enable unit comprises:

a coding unit configured to code the cell address to generate the row repair enable signal and the row drive signal;

a first output unit configured to output the row repair enable signal according to an enable state of the cell; and a second output unit configured to output the row drive signal according to an enable state of the cell.

14. The semiconductor device as set forth in claim 13, wherein the coding unit logically NAND combines the row address and an inverted column address of the cell address to generate the row repair enable signal, and the coding unit logically NAND combines the row address and the column address to generate the row drive signal.

15. The semiconductor device as set forth in claim 12, wherein each column repair enable unit comprises:
- a coding unit configured to code the cell address to generate the column repair enable signal and the column drive signal;
- a first output unit configured to output the column repair enable signal according to an enable state of the cell; and
- a second output unit configured to output the column drive signal according to an enable state of the cell.

16. The semiconductor device as set forth in claim 15, wherein the coding unit logically NAND combines the column address and an inverted row address of the cell address to generate the row repair enable signal, and the coding unit logically NAND combines the column address and the column address to generate the column drive signal.

* * * * *